(12) United States Patent
Wu et al.

(10) Patent No.: US 8,598,691 B2
(45) Date of Patent: Dec. 3, 2013

(54) SEMICONDUCTOR DEVICES AND METHODS OF MANUFACTURING AND PACKAGING THEREOF

(75) Inventors: Sheng-Yu Wu, Hsin-Chu (TW);
Tin-Hao Kuo, Hsin-Chu (TW);
Chen-Shien Chen, Zhubei (TW);
Ming-Da Cheng, Jhubei (JP)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/228,757

(22) Filed: Sep. 9, 2011

(65) Prior Publication Data
US 2013/0062741 A1    Mar. 14, 2013

(51) Int. Cl.
*H01L 23/695*   (2006.01)
*H01L 29/40*    (2006.01)

(52) U.S. Cl.
USPC ........... 257/666; 257/778; 257/782; 257/737; 257/E23.021; 257/E23.06

(58) Field of Classification Search
None
See application file for complete search history.

(56) References Cited

U.S. PATENT DOCUMENTS

| | | | |
|---|---|---|---|
| 5,859,474 A * | 1/1999 | Dordi | 257/737 |
| 6,037,547 A * | 3/2000 | Blish, II | 174/264 |
| 7,368,817 B2 | 5/2008 | Pendse | |
| 7,462,942 B2 | 12/2008 | Tan et al. | |
| 7,700,407 B2 | 4/2010 | Pendse | |
| 7,736,950 B2 | 6/2010 | Pendse et al. | |
| 8,047,421 B2 * | 11/2011 | Sri-Jayantha et al. | 228/180.21 |
| 8,207,608 B2 * | 6/2012 | Chew et al. | 257/738 |
| 2002/0000658 A1 | 1/2002 | Kuwabara et al. | |
| 2002/0179689 A1 * | 12/2002 | Tung | 228/197 |
| 2010/0193944 A1 | 8/2010 | Castro et al. | |
| 2010/0264542 A1 | 10/2010 | Pham et al. | |
| 2012/0098120 A1 * | 4/2012 | Yu et al. | 257/737 |
| 2012/0199966 A1 * | 8/2012 | Kuo et al. | 257/737 |

FOREIGN PATENT DOCUMENTS

| | | |
|---|---|---|
| JP | 11145199 A | 5/1999 |
| JP | 2000-208665 A | 7/2000 |
| JP | 2004-259888 A | 9/2004 |

* cited by examiner

*Primary Examiner* — Julio J Maldonado
*Assistant Examiner* — Harpreet Singh
(74) *Attorney, Agent, or Firm* — Slater & Matsil, L.L.P.

(57) ABSTRACT

Semiconductor devices and methods of manufacturing and packaging thereof are disclosed. In one embodiment, a semiconductor device includes an integrated circuit and a plurality of copper pillars coupled to a surface of the integrated circuit. The plurality of copper pillars has an elongated shape. At least 50% of the plurality of copper pillars is arranged in a substantially centripetal orientation.

20 Claims, 6 Drawing Sheets

SEMICONDUCTOR DEVICES AND METHODS OF MANUFACTURING AND PACKAGING THEREOF

CROSS-REFERENCE TO RELATED APPLICATIONS

This application relates to the following co-pending and commonly assigned patent applications: Ser. No. 13/023,011, filed on Feb. 8, 2011, entitled, "Elongated Bump Structure for Semiconductor Devices," and Ser. No. 12/908,946, filed on Oct. 21, 2010, entitled, "Centripetal Layout for Low Stress Chip Package," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

One type of packaging for semiconductor devices is referred to as a bump on trace (BOT) package. Solder bumps are formed on dies of a semiconductor wafer, and the dies are singulated. Die or "flip chips" are attached or soldered to traces on the BOT packages using a solder reflow process.

There can be misalignment problems when attaching the solder bumps of the die to traces on the BOT package, which can cause die gap non-uniformity. In some instances, electrical connections may not be made due to the misalignment, which increases yield losses in the packaged products.

Thus, what are needed in the art are improved packaging techniques for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently described embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
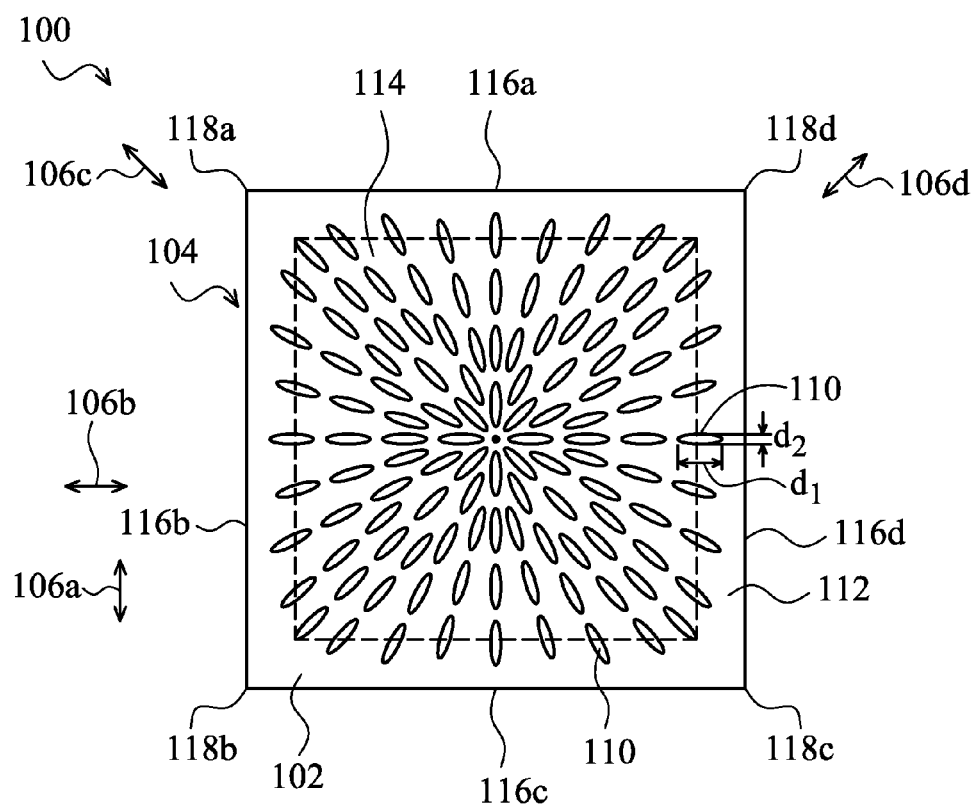
FIG. 1 is a top view of a semiconductor device in accordance with an embodiment, wherein all of a plurality of copper pillars on an integrated circuit are elongated and are arranged in a substantially centripetal and symmetric orientation.

Referring first to FIG. 1, there is shown a top view of a semiconductor device 100 in accordance with an embodiment of the present disclosure. The semiconductor device 100 includes an integrated circuit 102 which may comprise a die of a semiconductor wafer, for example. A plurality of bond pads 104 (not visible in FIG. 1; the bond pads 104 are disposed beneath copper pillars 110) are formed on the surface of the integrated circuit 102. The integrated circuit 102 may also include a under bump metallization (UBM) structure (not shown) to facilitate the interface and connections of the copper pillars 110 to the integrated circuit 102 and/or a seed layer (also not shown) proximate the bond pads 104.

A plurality of copper pillars 110 is coupled to the surface of the integrated circuit 102. For example, the plurality of copper pillars 110 may be formed on the bond pads 104 of the integrated circuit 102. The copper pillars 110 may be formed before singulation of the individual die from a semiconductor wafer, for example. The copper pillars 110 in a periphery region 112 may comprise a finer pitch than the copper pillars 110 in a central region 114 in some embodiments. Each copper pillar 110 comprises a metal stud or post comprising copper and solder coupled to a top portion of the metal stud, for example, not shown.

In embodiments of the present disclosure, the copper pillars 110 have an elongated shape, such as an oval, elliptical, or racetrack shape seen from a top view of the integrated circuit 102. The elongated copper pillars 110 may comprise a width having dimension $d_2$ that may comprise about 50 μm. The elongated copper pillars 110 may comprise a length having dimension $d_1$ that is greater than the width dimension $d_2$. The length $d_1$ of the elongated copper pillars 110 may comprise about 100 μm, for example. Alternatively, the copper pillars 110 may comprise other dimensions.

The copper pillars 110 are arranged in a starburst pattern across the surface of the semiconductor device 100 in the embodiment shown in FIG. 1 to achieve maximum symmetry and centripetal orientation, for example.

The orientation directions 106a, 106b, 106c, and 106d (and other directions, not shown) are selected for at least some of the elongated copper pillars 110 in the design process for the semiconductor device 100 to achieve improved alignment during packaging, in accordance with embodiments of the present disclosure. The plurality of copper pillars 110 are arranged in a substantially centripetal orientation, e.g., copper pillars 110 are aligned or directed towards a center 115 of the top surface of the integrated circuit 102, in accordance with embodiments. For example, the plurality of copper pillars 110 having the elongated shape may extend along their lengths $d_1$ towards edges 116a, 116b, 116c, and 116d of the surface of the integrated circuit 102 in at least the periphery region 112 of the surface of the integrated circuit 102, and also in other regions of the integrated circuit 102 such as in the central region 114.

In accordance with some embodiments, in the periphery region 112, all of the copper pillars 110 are arranged in a substantially centripetal orientation and/or are substantially symmetric. For example, the copper pillars 110 are arranged in a substantially centripetal pattern directed substantially towards the center 115 of the surface of the integrated circuit 102. Elongated sides (e.g., that extend along lengths $d_1$) of the plurality of copper pillars 110 comprising the elongated shape extend substantially lengthwise towards the center 115 of the surface of the integrated circuit 102. In accordance with other embodiments, in the central region 114, all of the copper pillars 110 are arranged in a substantially centripetal orientation and/or are substantially symmetric.

In the embodiment shown in FIG. 1, some of the plurality of copper pillars 110 proximate a first edge 116b (e.g., the left edge) of the surface of the integrated circuit 102 is oriented in a horizontal direction 106b, and some of the plurality of copper pillars 110 proximate a second edge 116a (e.g., the top edge) of the surface of the integrated circuit 102 is oriented in a vertical direction 106a. The second edge 116a of the surface of the integrated circuit 102 is adjacent the first edge 116b of the surface of the integrated circuit 102. Some of the plurality of copper pillars 110 proximate a third edge 116d (e.g., the right edge) of the surface of the integrated circuit 102 is also oriented in the horizontal direction 106b, the third edge 116d being opposite the first edge 116b. Likewise, some of the plurality of copper pillars 110 proximate a fourth edge 116c (e.g., the lower edge) of the surface of the integrated circuit 102 is oriented in a vertical direction 106a, the fourth edge 116c being opposite the second edge 116a.

Some of the elongated-shaped copper pillars 110 may also be oriented in a diagonal direction 106c extending from the upper left to the lower right and/or oriented in a diagonal direction 106d extending from the lower left to the upper right. For example, in FIG. 1, copper pillars 110 in the periphery region 112 proximate corners 118a and 118c of the surface of the integrated circuit 102 comprise an orientation in a diagonal direction 106c, and copper pillars 110 proximate corners 118b and 118d of the surface of the integrated circuit 102 comprise an orientation in a diagonal direction 106d.

In some embodiments, the copper pillars 110 are arranged in a symmetric pattern on the surface of the integrated circuit 102, as shown in FIG. 1. Alternatively, in other embodiments, the copper pillars 110 may be arranged in an asymmetric pattern on the surface of the integrated circuit 102.

Figure 2:
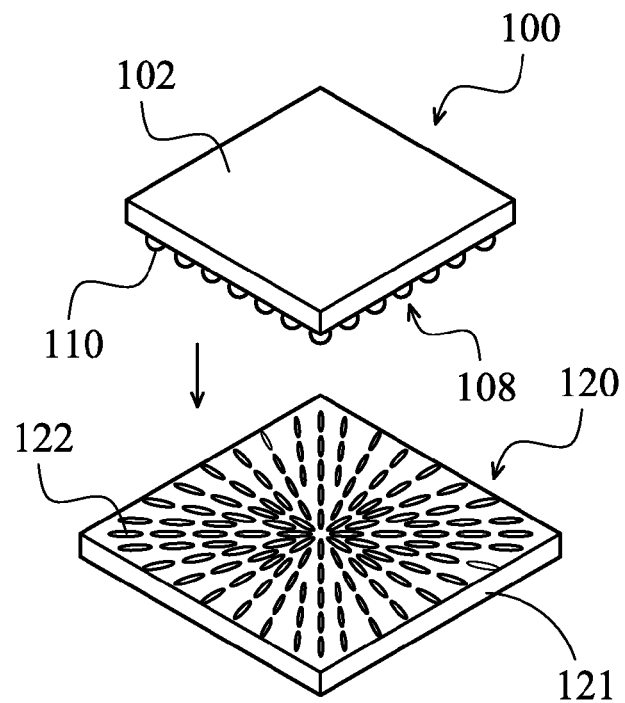
FIGS. 2 and 3 are perspective views of a method of packaging the semiconductor device shown in FIG. 1.
Figure 3:
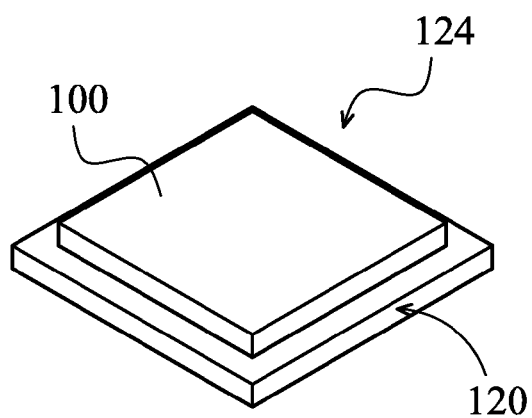

FIGS. 2 and 3 are perspective views of a method of packaging the semiconductor device 100 shown in FIG. 1. After forming copper pillars 110 on the plurality of bond pads 104 of the integrated circuit 102 such that the copper pillars 110 comprise an elongated shape and are arranged in a substantially centripetal orientation, the integrated circuit 102 or die is singulated from a semiconductor wafer, and a BOT package 120 is provided, as shown in FIG. 2. The BOT package 120 includes a substrate 121 and has a plurality of traces 122 formed on the substrate 121. The substrate 121 may comprise an insulative material such as a plastic or ceramic material, as examples, and may comprise a thickness of about 1 mm, for example. Alternatively, the substrate 121 may comprise other materials and dimensions. Traces 122 formed on the substrate 121 provide electrical connections and may comprise copper, tungsten, aluminum, or other materials or combinations thereof, for example.

The plurality of copper pillars 110 of the integrated circuit 102 is coupled to the plurality of traces 122 on the BOT package 120, forming a finished packaged semiconductor device 124, as shown in FIG. 3. The copper pillars 110 may be attached to the traces 122 using a solder reflow process, although alternatively, other methods may be used.

Referring again to FIG. 2, the plurality of traces 122 may comprise a first pattern, and the plurality of copper pillars 110 may comprise a second pattern. The second pattern may be substantially the same as the first pattern, so that the integrated circuit 102 may be aligned with the BOT package 120 during the packaging process.

Figure 4:
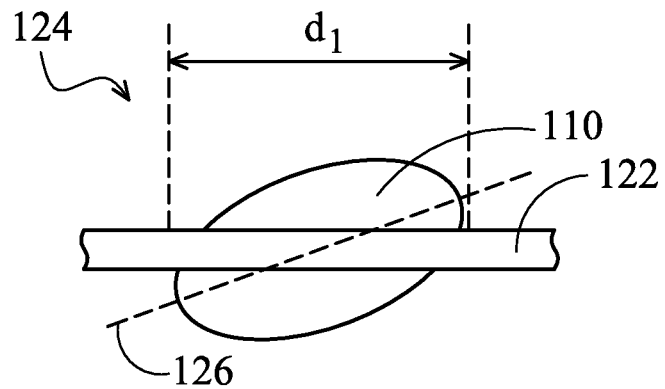
FIGS. 4 and 5 are top views of an elongated copper pillar attached to a trace of a BOT package in accordance with an embodiment, illustrating the self-alignment provided by the elongated-shaped copper pillars.
Figure 5:
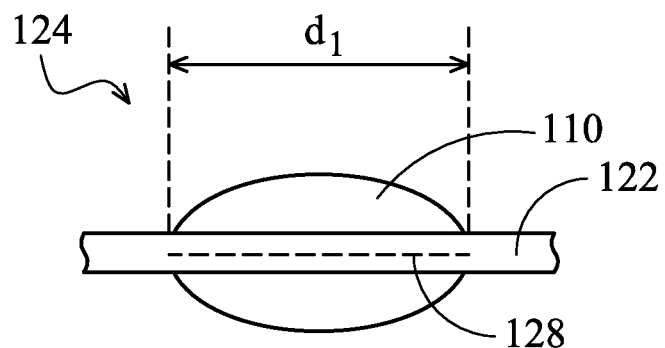

FIG. 4 shows a top view of an elongated copper pillar 110 attached to a trace 122 of a BOT package 120. If there is misalignment 126 of the copper pillars 110 having an elongated shape prior to the solder reflow process, then during the reflow process, due to the elongated shape of the copper pillars 110, self-alignment is advantageously achieved, as shown in FIG. 5, which shows the alignment 128 after the solder reflow process of the copper pillars 110 to the trace 122 on the BOT package 120.

FIGS. 6 through 10 show top views of semiconductor devices 200, 300, 400, 500, and 600, illustrating examples of different orientations and arrangements of elongated copper pillars 210, 310, 410, 510, and 610 on integrated circuits 202, 302, 402, 502, and 602 in accordance with embodiments of the present disclosure. Like numerals are used for the various elements in FIGS. 6 through 10 that were used to describe FIG. 1. To avoid repetition, each reference number shown in FIGS. 6 through 10 is not described again in detail herein. Rather, similar materials x00, x02, x04, x06, etc., are used to describe the various material layers and components shown as were used to describe FIG. 1, where x=1 in FIG. 1, x=2 in FIG. 6, x=3 in FIG. 7, x=4 in FIG. 8, x=5 in FIG. 9, and x=6 in FIG. 10.

In the embodiment shown in FIG. 1, all of the copper pillars 110 are arranged in a substantially centripetal orientation and are symmetric. In the embodiments shown in FIGS. 6 through 10, all of the plurality of copper pillars 210, 310, 410, 510, and 610 coupled to the surface of the integrated circuits 202, 302, 402, 502, and 602 comprise an elongated shape, and at least 50% of the copper pillars 210, 310, 410, 510, and 610 are arranged in a substantially centripetal direction, for example.

Figure 6:
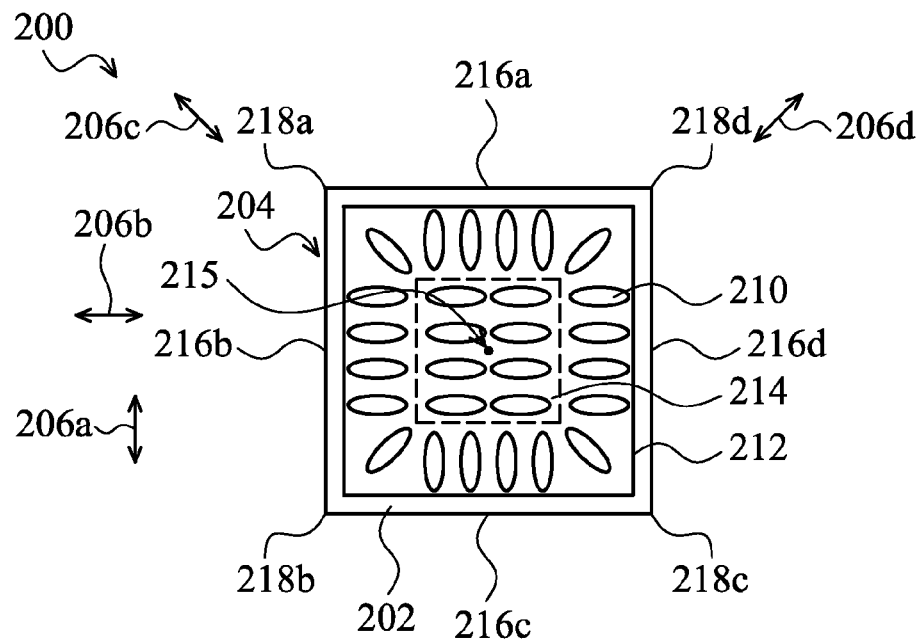
FIGS. 6 through 10 show top views of semiconductor devices, illustrating examples of different orientations and arrangements of elongated copper pillars on integrated circuits in accordance with embodiments of the present disclosure.

In FIG. 6, all of the copper pillars 210 in the periphery region 212 are arranged in a substantially centripetal orientation. The copper pillars 210 proximate the left edge 216b and the right edge 216d are arranged in a horizontal direction 206b, and the copper pillars 210 proximate the top edge 216a and lower edge 216c are arranged in a vertical direction 206a. A copper pillar 210 proximate the top left corner 218a and a copper pillar 210 proximate the lower right corner 218c are oriented in a diagonal direction 206c. A copper pillar 210 proximate the top right corner 218d and a copper pillar 210 proximate the lower left corner 218b are oriented in a diagonal direction 206d. All of the copper pillars 210 in the central region 214 are arranged in a horizontal direction 206b. Some of the copper pillars 210 in the central region 214 are also arranged in a centripetal direction.

Figure 7:
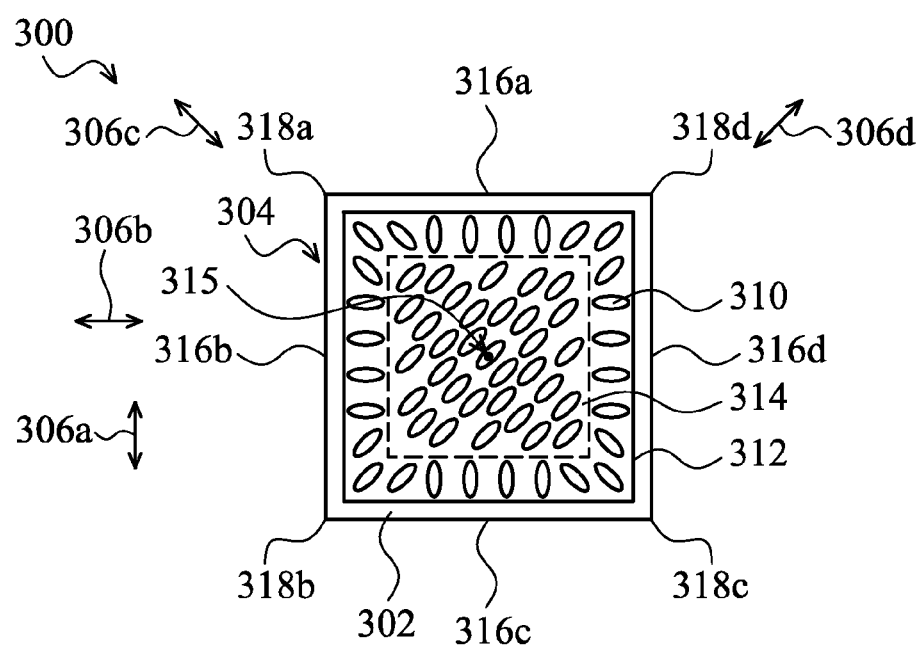

In FIG. 7, the copper pillars 310 in the periphery region 312 are arranged in a substantially centripetal orientation, as described for FIG. 6. A plurality of copper pillars 310 proximate the top left corner 318a and proximate the lower right corner 318c is oriented in a diagonal direction 306c. A plurality of copper pillars 310 proximate the top right corner 318d and the lower left corner 318b is oriented in a diagonal direction 306d. Three copper pillars 310 are shown positioned diagonally 306c or 306d in each corner 318a, 318b, 318c, and 318d; alternatively, two or more bumps 310 may be positioned diagonally 306c or 306d in each corner 318a, 318b, 318c, and 318d in other embodiments. All of the copper pillars 310 in the central region 314 are arranged in a diagonal direction 306d in this embodiment. Alternatively, all of the copper pillars 310 in the central region 314 may be arranged in a diagonal direction 306c or a vertical direction 306a, for example, not shown.

Figure 8:
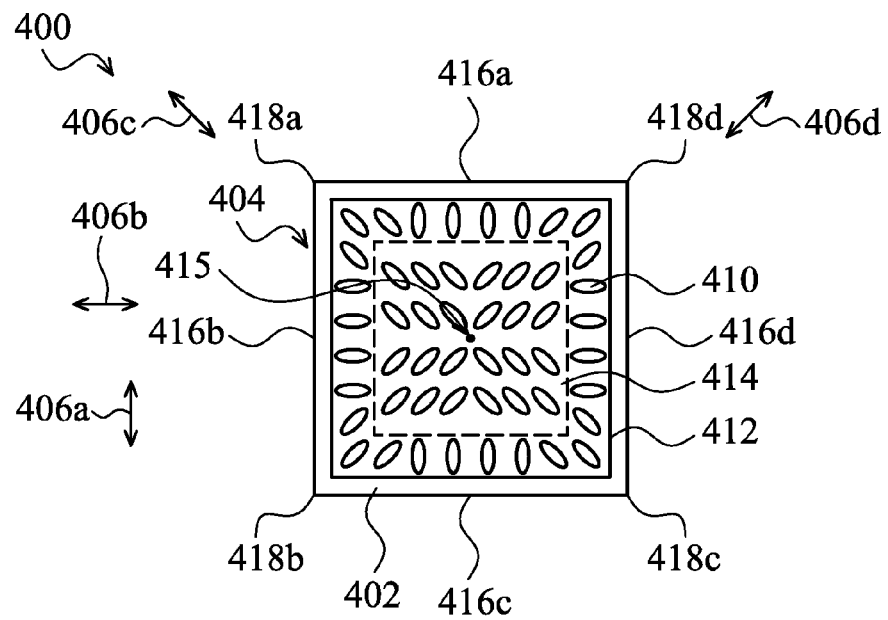
Figure 9:
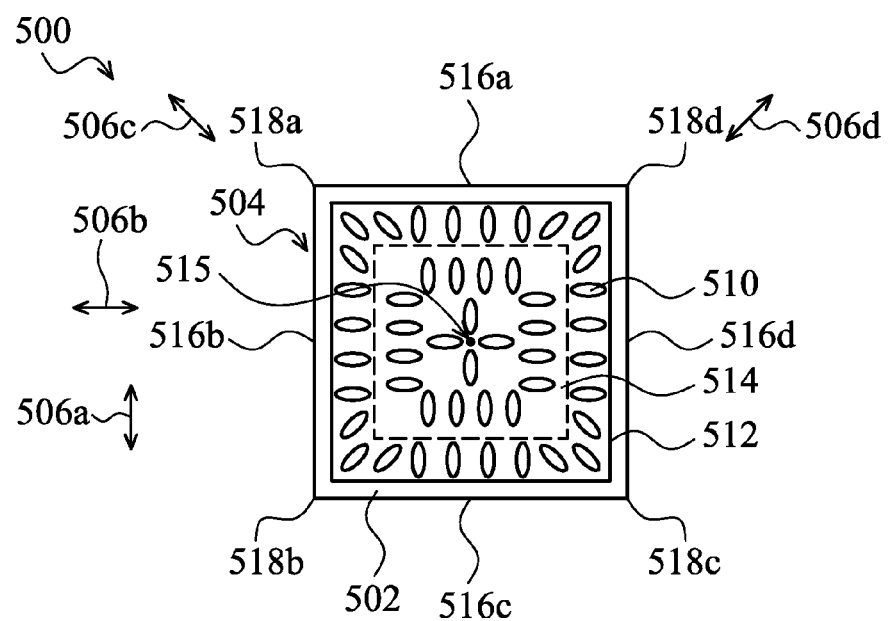
Figure 10:
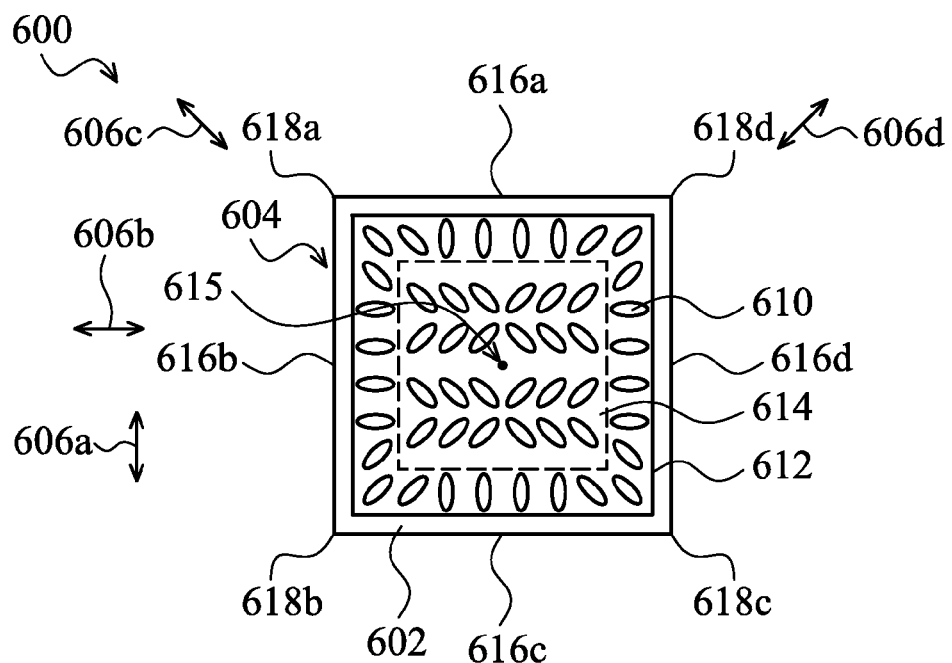

FIGS. 8, 9, and 10 show embodiments wherein the copper pillars 410, 510, and 610 having an elongated shape are arranged in the periphery region 412, 512, and 612 as described for FIG. 7, and wherein all of the copper pillars 410, 510, and 610 in the periphery region 412, 512, and 612 are arranged in a substantially centripetal orientation. The copper pillars 410, 510, and 610 may comprise various shapes and layouts to achieve an arrangement in the central regions 414, 514, and 614 wherein all of the copper pillars 410, 510, and 610 have a substantially centripetal orientation, as shown. For example, in FIGS. 8 and 10, the copper pillars 410 and 610 in the central regions 414 and 614 are oriented in a combination of diagonal directions 406c and 406d, and 606c and 606d. In FIG. 9, the copper pillars 510 in the central region 514 are oriented in a combination of vertical and horizontal directions 506a and 506b, respectively. Alternatively, in other embodiments, the copper pillars 410, 510, 610 in the central regions 414, 514, and 614 may be arranged in various other combinations of orientation directions 406a, 406b, 406c, 406d, 506a, 506b, 506c, 506d, 606a, 606b, 606c, 606d, and/or other directions, for example, not shown.

Figure 11:
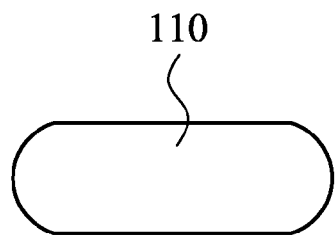
FIG. 11 shows a top view of an elongated copper pillar that comprises a racetrack shape.

In some embodiments, the copper pillars 110 (and also copper pillars 210, 310, 410, 510, and 610) comprising the elongated shape may comprise a racetrack shape in a top view of the semiconductor device 100, as shown in FIG. 11. The copper pillars 110 comprise a rectangular shape with curved corners in this embodiment. The copper pillars 110 may comprise a rectangular shape with two curved ends, as shown, in some embodiments.

Embodiments of the present disclosure include the semiconductor devices 100, 200, 300, 400, 500, and 600 described herein and also include manufacturing processes for the semiconductor devices 100, 200, 300, 400, 500, and 600. Embodiments also include semiconductor devices 100, 200, 300, 400, 500, and 600 packaged in BOT packages 120 and methods of packaging semiconductor devices 100, 200, 300, 400, 500, and 600 as described herein.

Advantages of embodiments of the present disclosure include providing novel semiconductor devices 100, 200, 300, 400, 500, and 600 that are self-aligning during packaging due to the use of elongated copper pillars 110, 210, 310, 410, 510, and 610 and also due to the substantially centripetal orientation of the elongated copper pillars 110, 210, 310, 410, 510, and 610 on the substrates 121 of BOT packages 120. Forming elongated-shaped copper pillars 110, 210, 310, 410, 510, and 610 in centripetal orientations as described herein improves alignment and die gap uniformity. Higher yields during the packaging process are achievable using embodiments of the present disclosure. The novel semiconductor devices 100, 200, 300, 400, 500, and 600 and methods described herein are easily implementable in manufacturing and packaging process flows.

At least 50% of the plurality of copper pillars 110, 210, 310, 410, 510, and 610 comprise an elongated shape and are arranged in a substantially centripetal orientation. However, in other embodiments, larger percentages, e.g., 60%, 75%, or greater, (e.g., 100% as shown in FIG. 1) of copper pillars 110, 210, 310, 410, 510, and 610 may have the elongated shape and may be arranged in a substantially centripetal orientations across the surface of the integrated circuits 102, 202, 302, 402, 502, and 602, to further increase the advantages achieved by the present disclosure. In other embodiments, such as the one shown in FIG. 1, all of the plurality of copper pillars 110 comprise an elongated shape and are arranged in a substantially centripetal orientation and are symmetric.

Embodiments of the present disclosure are described herein with reference to flip chip integrated circuit designs packaged in BOT packages. Embodiments of the present disclosure also have useful application in other wafer level packaging (WLP) applications, multi-chip packaging systems, and other packaging schemes for semiconductor devices, as examples. Embodiments of the disclosure are useful for any size of integrated circuits 102, 202, 302, 402, 502, and 602.

The embodiments illustrated in FIGS. 1 and 8 through 10 have a particularly greater number of copper pillars 410, 510, and 610 comprising the elongated shape oriented in a substantially centripetal orientation, which may provide enhanced joint alignment in some applications, for example. In other embodiments, patterns for copper pillars 110, 210, 310, 410, 510, and 610 that are substantially symmetric may provide enhanced joint alignment in some applications, as another example.

In accordance with one embodiment of the present disclosure, a semiconductor device includes an integrated circuit and a plurality of copper pillars coupled to a surface of the integrated circuit. The plurality of copper pillars has an elongated shape and at least 50% are arranged in a substantially centripetal orientation.

In another embodiment, a method of manufacturing a semiconductor device includes providing an integrated circuit, and forming a plurality of bond pads on a surface of the integrated circuit. A plurality of copper pillars is formed on the plurality of bond pads on the surface of the integrated circuit. The plurality of copper pillars comprises an elongated shape and at least 50% are arranged in a substantially centripetal orientation.

In yet another embodiment, a method of packaging a semiconductor device is disclosed, the semiconductor device including an integrated circuit with a plurality of bond pads disposed on a surface thereof. The method includes forming a plurality of a copper pillars comprising an elongated shape on the plurality of bond pads of the integrated circuit such that at least 50% of the plurality of copper pillars are arranged in a substantially centripetal orientation. A BOT package is provided, the BOT package including a plurality of traces thereon. The plurality of copper pillars of the integrated circuit is coupled to the plurality of traces on the BOT package.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
an integrated circuit; and
a plurality of copper pillars coupled to a surface of the integrated circuit, the plurality of copper pillars being in a central region and a periphery region of the surface of the integrated circuit, the central region being defined by inner boundaries of the periphery region, wherein all of the plurality of copper pillars comprise an elongated shape in a plane parallel to the surface of the integrated circuit, and wherein at least 50% of the plurality of copper pillars are arranged in a substantially centripetal orientation.

2. The semiconductor device according to claim 1, wherein all of the plurality of copper pillars coupled to the surface of the integrated circuit are arranged in a substantially symmetric orientation.

3. The semiconductor device according to claim 1, wherein all of the plurality of copper pillars coupled to the surface of the integrated circuit are arranged in a substantially centripetal orientation.

4. The semiconductor device according to claim 1, wherein all of the plurality of copper pillars in the periphery region of the surface of the integrated circuit are arranged in a substantially symmetric orientation or are arranged in a substantially centripetal orientation.

5. The semiconductor device according to claim 1, wherein all of the plurality of copper pillars in the central region of the surface of the integrated circuit comprise a substantially symmetric orientation or are arranged in a substantially centripetal orientation.

6. The semiconductor device according to claim 1, wherein the plurality of copper pillars comprises an oval, elliptical, or racetrack shape.

7. The semiconductor device according to claim 1, wherein at least one of the plurality of copper pillars in the periphery region proximate corners of the surface of the integrated circuit comprises an orientation in a diagonal direction.

8. The semiconductor device according to claim 7, wherein a plurality of copper pillars proximate a first edge of the surface of the integrated circuit is oriented in a horizontal direction, and wherein a plurality of copper pillars proximate a second edge of the surface of the integrated circuit is oriented in a vertical direction.

9. The semiconductor device according to claim 8, wherein the second edge of the surface of the integrated circuit is adjacent the first edge of the surface of the integrated circuit, wherein a plurality of copper pillars proximate a third edge of the surface of the integrated circuit is oriented in the horizontal direction, the third edge being opposite the first edge, and wherein a plurality of copper pillars proximate a fourth edge of the surface of the integrated circuit is oriented in the vertical direction, the fourth edge being opposite the second edge.

10. A packaged semiconductor device including the semiconductor device of claim 1, further comprising a bump-on-trace (BOT) package coupled to the integrated circuit, the BOT package comprising a substrate and a plurality of traces disposed on the substrate, wherein the plurality of copper pillars of the integrated circuit is coupled to the plurality of traces on the BOT package.

11. A semiconductor device comprising:
a die having a first surface; and
copper pillars on the first surface of the die, wherein the copper pillars are all of the copper pillars on the first surface, and wherein each of the copper pillars on the first surface have an elongated shape in a plane parallel to the first surface.

12. The semiconductor device of claim 11, wherein at least 50% of the copper pillars on the first surface are arranged in a substantially centripetal pattern.

13. The semiconductor device of claim 11, wherein each of the copper pillars comprises an oval, an elliptical, or a racetrack shape.

14. The semiconductor device of claim 11, wherein the all of the copper pillars on the first surface are aligned towards a centroid of the first surface.

15. The semiconductor device of claim 11, wherein all of the copper pillars in a periphery region of the first surface are arranged in a substantially centripetal orientation.

16. The semiconductor device of claim 15, wherein all of the copper pillars in a central region of the first surface are aligned in a same direction.

17. The semiconductor device of claim 16, wherein the all of the copper pillars in the central region of the first surface are aligned towards a corner of the first surface.

18. The semiconductor device of claim 15, wherein all of the copper pillars in a central region of the first surface are aligned in a symmetrical orientation.

19. The semiconductor device of claim 11, wherein the copper pillars proximate a first edge of the first surface are oriented in a first direction, and wherein the copper pillars proximate a second edge of the first surface are oriented in a second direction, the second direction being perpendicular to the first direction.

20. The semiconductor device of claim 19, wherein the second edge intersects the first edge, wherein the copper pillars proximate a third edge of the first surface are oriented in the first direction, the third edge being opposite the first edge, and wherein the copper pillars proximate a fourth edge of the first surface are oriented in the second direction, the fourth edge being opposite the second edge.

* * * * *